(12) United States Patent
Lu et al.

(10) Patent No.: US 10,090,414 B2
(45) Date of Patent: Oct. 2, 2018

(54) TFT SUBSTRATE MANUFACTURE METHOD

(71) Applicant: SHENZHEN CHINA STAR OPTOELECTRONICS TECHNOLOGY CO., LTD., Shenzhen, Guangdong (CN)

(72) Inventors: Macai Lu, Guangdong (CN); Jiangbo Yao, Guangdong (CN); Shijian Qin, Guangdong (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 7 days.

(21) Appl. No.: 15/513,562

(22) PCT Filed: Feb. 13, 2017

(86) PCT No.: PCT/CN2017/073330
§ 371 (c)(1),
(2) Date: Mar. 23, 2017

(65) Prior Publication Data
US 2018/0233598 A1 Aug. 16, 2018

(30) Foreign Application Priority Data
Jan. 3, 2017 (CN) .......................... 2017 1 0002056

(51) Int. Cl.
*H01L 21/84* (2006.01)
*H01L 29/786* (2006.01)
*H01L 29/51* (2006.01)
*H01L 21/02* (2006.01)
*H01L 29/423* (2006.01)

(52) U.S. Cl.
CPC .... *H01L 29/78603* (2013.01); *H01L 21/0262* (2013.01); *H01L 29/4232* (2013.01); *H01L 29/517* (2013.01); *G02F 2201/123* (2013.01)

(58) Field of Classification Search
None
See application file for complete search history.

(56) References Cited

U.S. PATENT DOCUMENTS

2004/0266323 A1* 12/2004 Oshima ................ B24B 37/044
451/41
2016/0035865 A1* 2/2016 Nagamatsu ......... H01L 21/8221
438/104

* cited by examiner

*Primary Examiner* — Richard Booth
(74) *Attorney, Agent, or Firm* — Soroker Agmon Nordman

(57) ABSTRACT

The present invention provides a TFT (Thin Film Transistor) substrate manufacture method, which includes forming a TFT gate electrode on a substrate, sequentially forming a first insulation layer, an active layer, a source electrode, and a drain electrode, and then forming a second insulation layer and coating a photoresist thereon, defining a pixel electrode pattern, forming a drain VIA hole on the second insulation layer, depositing a pixel electrode layer after preparing suede on the photoresist, and permeating the suede with a stripping liquid to remove the photoresist and the pixel electrode layer on the photoresist so as to form a pixel electrode connecting to the drain electrode via the drain VIA hole.

20 Claims, 3 Drawing Sheets

TFT SUBSTRATE MANUFACTURE METHOD

TECHNICAL FIELD OF THE DISCLOSURE

The present invention relates to a display technology, and more particularly, to a TFT (Thin Film Transistor) substrate manufacture method.

BACKGROUND OF THE DISCLOSURE

As with the development of TFT (Thin Film Transistor) technology, the number of masks required in a TFT manufacture process is reduced from five/six to four in current mainstream. The cost is dramatically reduced. Whenever a photomask process is reduced, the cost of equipment and processing time will be reduced to a great deal. This greatly increases product competitiveness. Since one photomask process is saved, a TFT product carried out using three photomasks dramatically reduces the cost and its related technology is more popular.

Currently, a TFT technology carried out in three photomasks usually manufactures a PV (passivating) layer and a pixel layer (e.g., ITO, Indium Tin Oxide) in one photomask process. However, a problem of peeling off the ITO on a PR (photoresist) is occurred. Usually, it takes a long time for peeling off the ITO on the PR after the pixel ITO is deposited. This affects manufacture speed. Also, the residue from the PR peeling process and rough edge seriously affect the manufacture or the performance of a product. In addition, the currently used PR/PV undercut approaches have to etch the PV layer, and therefore a large step profile is easily occurred between the ITO and the PV layer. This affects the produce feature.

Therefore, there are drawbacks in the existing skills and an improvement is required.

SUMMARY OF THE DISCLOSURE

The objective of the present invention is to provide an improved TFT (Thin Film Transistor) substrate manufacture method.

To solve above problems, the technical schemes provide in the present invention are described below.

The present invention provides a TFT substrate manufacture method, comprising the steps of: depositing a first metal layer on a substrate and utilizing a first photomask process to form a TFT gate electrode; depositing a first insulation layer, an active layer, and a second metal layer sequentially on the substrate and utilizing a second photomask process to make the second metal layer form a source electrode and a drain electrode at two ends of the active layer, depositing a second insulation layer on the substrate and forming a photoresist layer on the second insulation layer, and utilizing a third photomask process to pattern the photoresist layer to form a first photoresist layer of a first thickness and a second photoresist layer of a second thickness, where the second thickness is greater than the first thickness, the first photoresist layer and the second photoresist layer being disposed at intervals and a gap region being formed therebetween, and forming a drain VIA hole in the second insulation layer with respect to the gap region; removing the first photoresist layer, and preparing suede on the second photoresist layer to form a suede on a surface of the second photoresist layer; and depositing a pixel electrode layer on the substrate, and permeating a surface uncovered by the pixel electrode layer from the suede of the second photoresist layer with a stripping liquid in wet etching, removing the second photoresist layer and the pixel electrode layer covering the second photoresist layer so as to form a pixel electrode, which is connected to the drain electrode via the drain VIA hole.

In the TFT substrate manufacture method of the present invention, the step of forming the drain VIA hole in the second insulation layer with respect to the gap region comprises: utilizing dray etching to forming the drain VIA hole in the second insulation layer with respect to the gap region.

In the TFT substrate manufacture method of the present invention, the step of removing the first photoresist layer comprises: utilizing a photoresist ashing process to make the first photoresist layer peel off.

In the TFT substrate manufacture method of the present invention, the step of preparing suede on the second photoresist layer comprises: utilizing dry etching to prepare suede on the second photoresist layer.

In the TFT substrate manufacture method of the present invention, the suede on a photoresist surface is formed by nanopillars, a height of the nanopillars is 10 A to 10000 A with respect to the photoresist surface, and distances between the nanopillars are ranged from 10 A to 20000 A.

In the TFT substrate manufacture method of the present invention, a gas utilized to prepare the suede is Ar, O3, He, SF6, CF4, C4F8, or their combinations, and a pressure adopted in the etching process is 5 mT to 10000 mT.

In the TFT substrate manufacture method of the present invention, the step of depositing the first insulation layer, the active layer, and the second metal layer sequentially on the substrate comprises: utilizing chemical vapor deposition to deposit the first insulation layer, the active layer, and the second metal layer sequentially on the substrate.

In the TFT substrate manufacture method of the present invention, the pixel electrode layer is made of ITO (Indium Tin Oxide).

In the TFT substrate manufacture method of the present invention, the second photomask process is a half-tone or a gray-tone photomask process.

In the TFT substrate manufacture method of the present invention, the active layer is made of A-Si.

Compared to an existing TFT substrate manufacture method, in the present invention a first metal layer is deposited on a substrate and a first photomask process is utilized to form a TFT gate electrode. A first insulation layer, an active layer, and a second metal layer are sequentially deposited on the substrate and a second photomask process is utilized to make the second metal layer form a source electrode and a drain electrode at two ends of the active layer. A second insulation layer is deposited on the substrate and a photoresist layer is formed on the second insulation layer, and a third photomask process is utilized to pattern the photoresist layer to form a first photoresist layer of a first thickness and a second photoresist layer of a second thickness, where the second thickness is greater than the first thickness. The first photoresist layer and the second photoresist layer are disposed at intervals and a gap region being formed therebetween, and the second insulation layer has a drain VIA hole formed with respect to the gap region. The first photoresist layer is removed, and suede is prepared on the second photoresist layer to form a suede on a surface of the second photoresist layer. A pixel electrode layer is deposited on the substrate, and a stripping liquid is used to permeate a surface uncovered by the pixel electrode layer from the suede of the second photoresist layer in wet etching. The second photoresist layer and the pixel electrode layer covering the second photoresist layer are removed so as to form a pixel electrode, which is connected to the drain electrode via the drain VIA hole. In this scheme, only three photomask processes are required to manufacture a TFT substrate, and it can be efficient to peel off the photoresist layer in depositing the pixel electrode layer after the step of preparing suede on the photoresist. Also, there is no obvious step configuration between the pixel electrode and the second insulation layer. The present invention improves the efficiency and reduces the difficulty in manufacture.

DETAILED DESCRIPTION OF THE DISCLOSURE

The following descriptions for the respective embodiments are specific embodiments capable of being implemented for illustrations of the present invention with referring to appending figures. In describing the present invention, spatially relative terms such as "upper", "lower", "front", "back", "left", "right", "inner", "outer", "lateral", and the like, may be used herein for ease of description as illustrated in the figures. Therefore, the spatially relative terms used herein are intended to illustrate the present invention for ease of understanding, but are not intended to limit the present invention.

In the appending drawings, units with similar structures are indicated by the same reference numbers.

Figure 1:
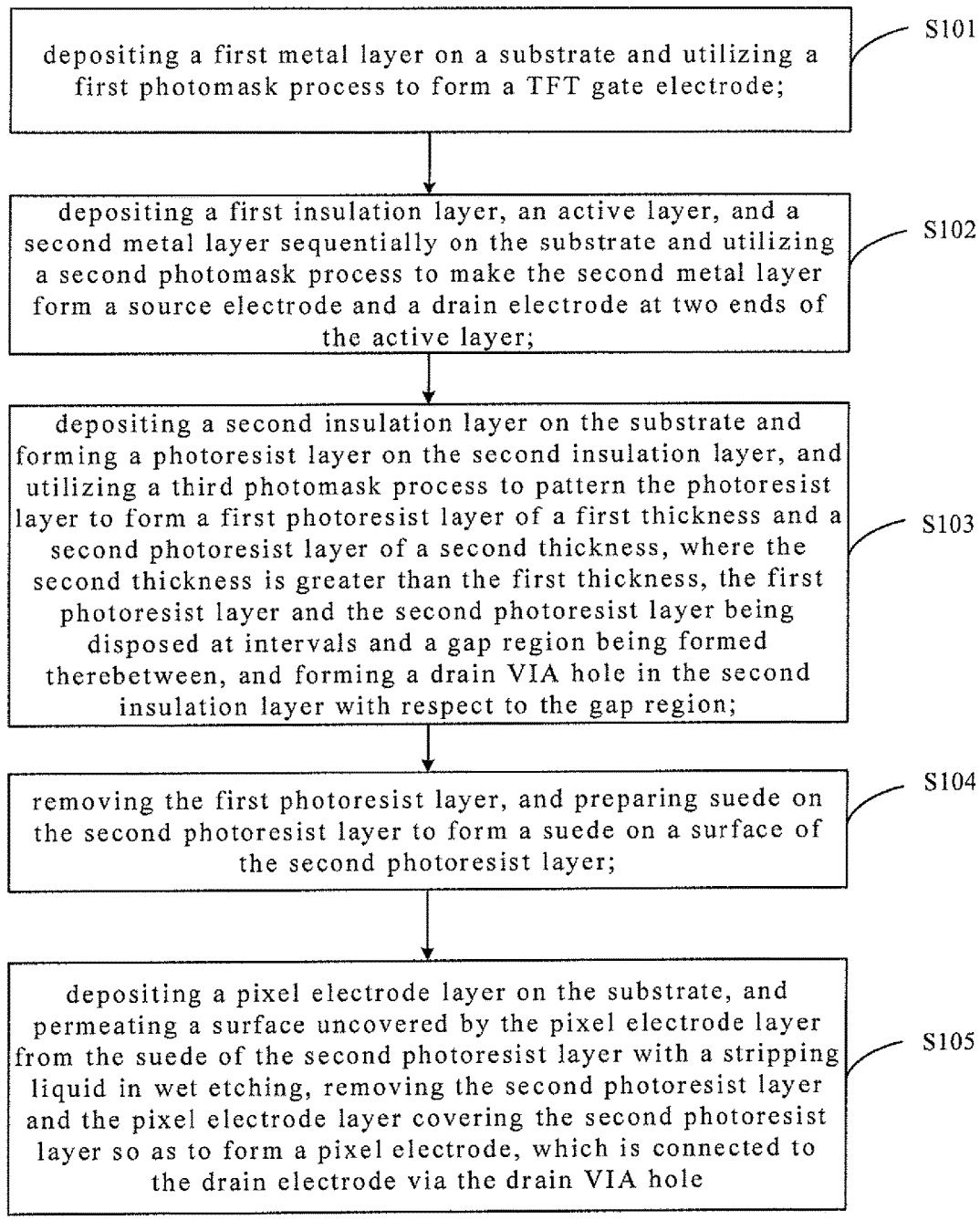
FIG. 1 is a flow chart of a TFT (Thin Film Transistor) substrate manufacture method in accordance with a preferred embodiment of the present invention.

Please refer to FIG. 1, which is a flow chart of a TFT (Thin Film Transistor) substrate manufacture method in accordance with the present invention. The TFT substrate manufacture method includes the followings steps.

Step S101: depositing a first metal layer on a substrate and utilizing a first photomask process to form a TFT gate electrode.

Step S102: depositing a first insulation layer, an active layer, and a second metal layer sequentially on the substrate and utilizing a second photomask process to make the second metal layer form a source electrode and a drain electrode at two ends of the active layer.

Step S103: depositing a second insulation layer on the substrate and forming a photoresist layer on the second insulation layer, and utilizing a third photomask process to pattern the photoresist layer to form a first photoresist layer of a first thickness and a second photoresist layer of a second thickness, where the second thickness is greater than the first thickness, the first photoresist layer and the second photoresist layer being disposed at intervals and a gap region being formed therebetween, and the second insulation layer having a drain VIA hole formed with respect to the gap region.

Step S104: removing the first photoresist layer, and preparing suede on the second photoresist layer to form a suede on a surface of the second photoresist layer.

S105: depositing a pixel electrode layer on the substrate, and permeating a surface uncovered by the pixel electrode layer from the suede of the second photoresist layer with a stripping liquid in wet etching, removing the second photoresist layer and the pixel electrode layer covering the second photoresist layer so as to form a pixel electrode, which is connected to the drain electrode via the drain VIA hole.

Above steps of the TFT substrate manufacture method will be descried in detail below with reference to FIGS. 2 to 4.

Figure 2:
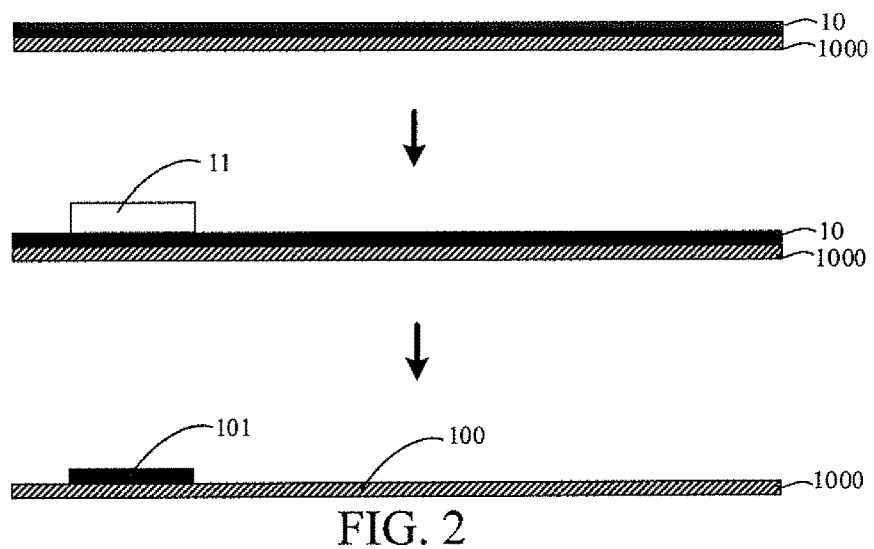
FIG. 2 is a schematic diagram showing a first photomask process in accordance with a preferred embodiment of the present invention.

Please refer to FIG. 2, which is a schematic diagram showing a first photomask process in accordance with a preferred embodiment of the present invention. Step S101 of the present invention can be understood by referring to FIG. 2, from top to bottom.

In Step S101, firstly, Chemical Vapor Deposition (CVD) can be utilized to form a first metal layer 10 on a substrate 1000. The metal layer 10 may be manufactured by using Chromium (Cr) or chromium alloys, or an alloy of molybdenum (Mo) and tantalum (Ta), or Aluminum (Al) or aluminum alloys. After that, the first metal layer 10 is coated by a photoresist 11 of uniform thickness and the coated photoresist 11 undergoes exposure, developing, and etching using a first photomask process to form a TFT gate electrode 101. The first photomask process can be just a general photomask process.

Figure 3:
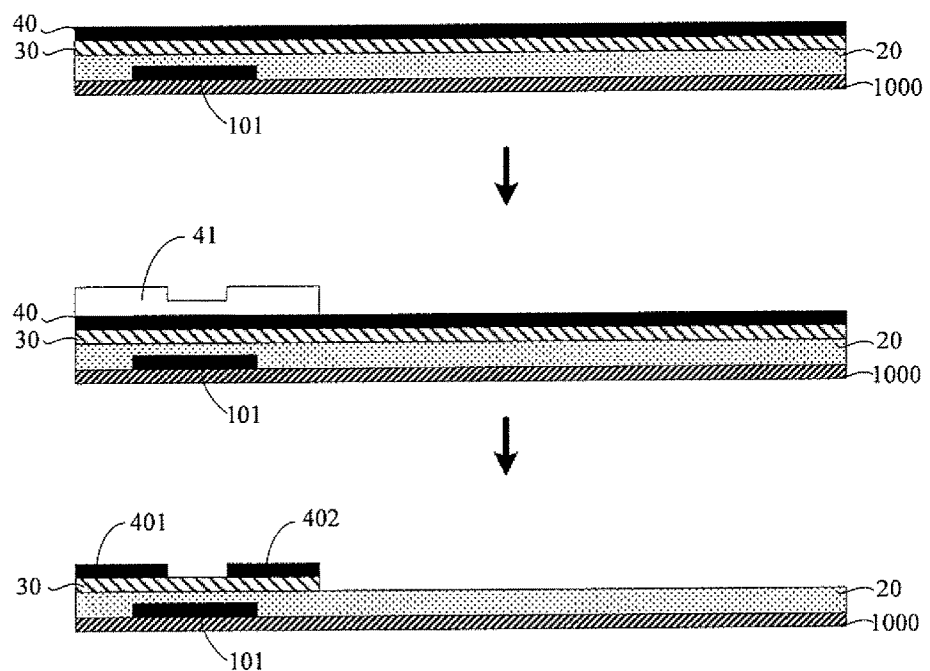
FIG. 3 is a schematic diagram showing a second photomask process in accordance with a preferred embodiment of the present invention.

Please refer to FIG. 3, which is a schematic diagram showing a second photomask process in accordance with a preferred embodiment of the present invention. Step S102 of the present invention can be understood by referring to FIG. 3, from top to bottom.

In Step S102, firstly, a first insulation layer 20, an active layer 30, and a second metal layer 40 are sequentially deposited on the TFT gate electrode 101 and the substrate 1000 uncovered by the TFT gate electrode 101. After that, a photoresist 41 is coated on the second metal layer 40 and the coated photoresist 41 undergoes exposure, developing, and etching using a second photomask process to form a patterned active layer 30 opposite to the TFT gate electrode 101 and make the second metal layer 40 form a source electrode 401 and a drain electrode 402 disposed separately at two ends of the patterned active layer 30.

There are various ways for the depositing step, for example, CVD may be adopted. The second photomask process can be a half-tone or a gray-tone photomask process. The first insulation layer 20 can be a single-layer structure but can also be a two-layer structure. The single-layer structure can be formed by SiO, SiNx, or AlO. The two-layer structure is generally manufactured by SiNx. The active layer 30 is opposite to the TFT gate electrode 101 and can be manufactured by a semiconductor material, for example, A-Si. The second metal layer 40 can be manufactured by using aluminum alloys, Aluminum, or Chromium. The source electrode 401 is configured to connect a data signal line while the drain electrode 402 is configured to connect a pixel electrode.

Figure 4:
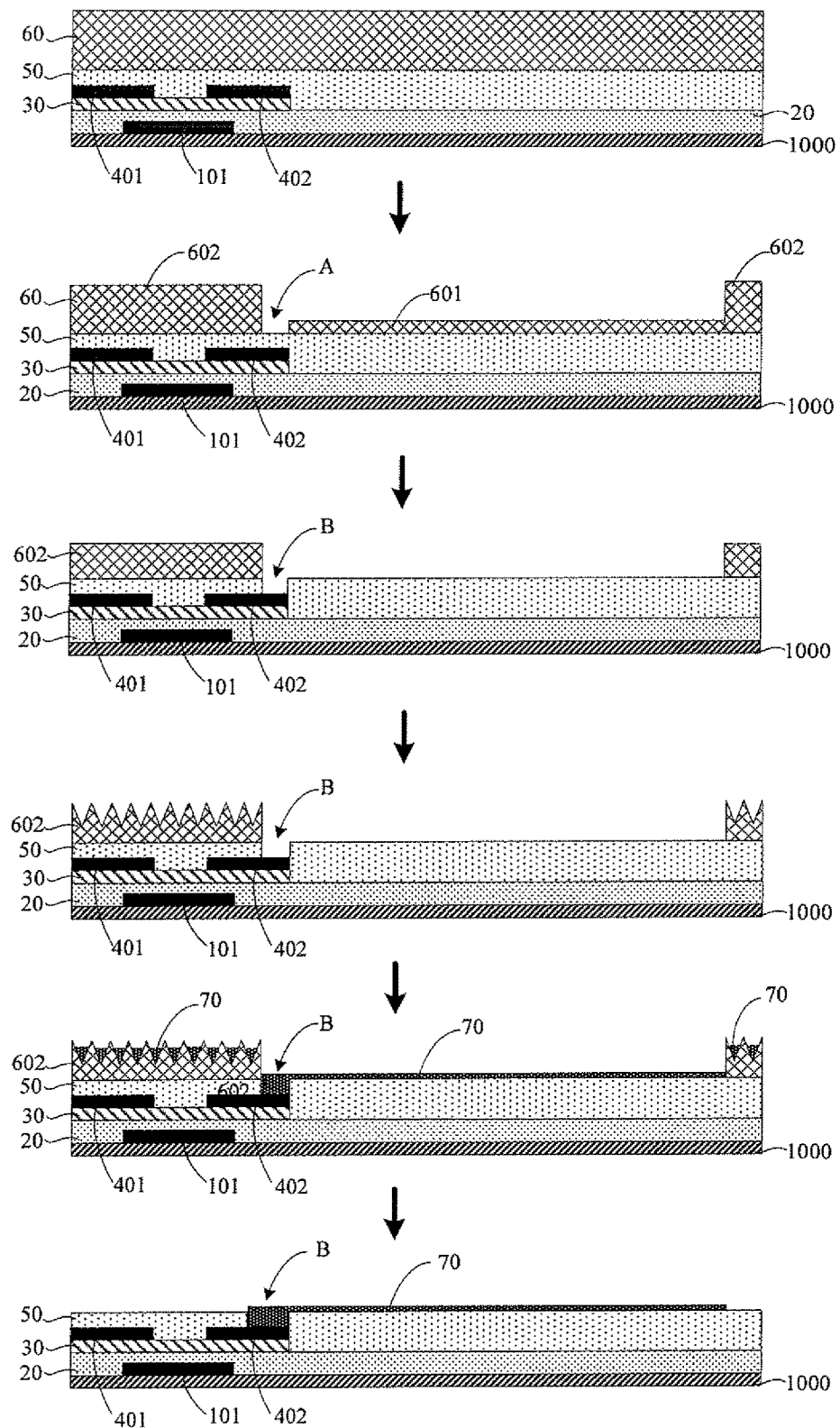
FIG. 4 is a schematic diagram showing a third photomask process in accordance with a preferred embodiment of the present invention.

Please refer to FIG. 4, which is a schematic diagram showing a third photomask process in accordance with a preferred embodiment of the present invention. Step S103 of the present invention can be understood by referring to FIG. 4, from top to bottom.

In Step S103, firstly, by using CVD, a second insulation layer (i.e., a passivating layer) 50 is formed on the source electrode 401, the drain electrode 402, the active layer 30 uncovered by the source electrode 40 and the drain electrode 402, and the first insulation layer 20 uncovered by the active layer 30. The material of the second insulation layer 50 can be SiNx or SiO. After that, the second insulation layer 50 is coated by a photoresist layer 60 of uniform thickness and the photoresist layer 60 undergoes exposure and developing using a third photomask process so as to form a first photoresist layer 601 of a first thickness and a second photoresist layer 602 of a second thickness, where the second thickness is greater than the first thickness. In such a manner, the first photoresist layer 601 and the second photoresist layer 602 are disposed separately, thereby forming a gap region A for defining a to-be-dug portion of the second insulation layer 50. After that, by using dry etching, a portion of the second insulation layer below the gap region A is removed, thereby forming a drain VIA hole B in the second insulation layer 50, which exposes a corresponding surface of the drain electrode. The exposed surface of the drain electrode is smaller than or equal to a half area of an upper surface of the source electrode. One-third of that is set in an embodiment. The third photomask process can be a half-tone or a gray-tone photomask process.

With continued reference to FIG. 4, after the drain VIA hole B is formed, in Step S104, a photoresist ashing process may be adopted to make the first photoresist layer 601 of a less thickness peel off so as to expose a corresponding surface of the second insulation layer, and meanwhile, the second photoresist layer 602 of a great thickness is thinned. For example, in an ideal case, assuming that the thickness of the first photoresist layer is d and the thickness of the second photoresist layer is 3d, the thickness of the second photoresist layer 602 becomes 2d after the photoresist ashing process.

Next, prepare suede on the second photoresist layer 602. The second photoresist layer 602 is atomized by etching or other approaches, thereby forming a suede with organized concave-convex surface on the photoresist surface. The suede can be protruded nanopillars. The height of the nanopillars can be 10 A to 10000 A with respect to the photoresist surface. The distances between the nanopillars may be ranged from 10 A to 20000 A. A gas utilized to prepare the suede can be Ar, O3, He, SF6, CF4, C4F8, or their combinations. The pressure can be 5 mT to 10000 mT in the etching process.

With continued reference to FIG. 4, after the step of preparing suede on the photoresist layer 602, in Step S105, a pixel electrode made of ITO (Indium Tin Oxide) or other conductive materials is deposited on the entire surface, thereby forming a pixel electrode 70 on the suede of the photoresist layer 602, the exposed surface of the second insulation layer 50, and the exposed surface of the drain electrode 402. After that, the second photoresist layer 602 and the pixel electrode (ITO or other conductive material) covering the second photoresist layer 602 are removed using a photoresist peeling-off process.

The pixel electrode (ITO or other conductive material) cannot completely cover the suede of the second photoresist layer 602 since the suede of the photoresist layer 602 acts as a shadow. Therefore, during the photoresist peeling-off process, it is easy for a stripping liquid to contact the exposed photoresist surface such a high efficiency is carried out in peeling off the photoresist layer 60 from the second insulation layer 50. After that, the pixel electrode ITO is annealed so as to form the pixel electrode 70 on the exposed surface of the second insulation layer 50 and the exposed surface of the drain electrode 402. The pixel electrode 70 is connected to the drain electrode 402 via the drain VIA hole B.

In the TFT substrate manufacture method of the present preferred embodiment, a first metal layer is deposited on a substrate and a first photomask process is utilized to form a TFT gate electrode. A first insulation layer, an active layer, and a second metal layer are sequentially deposited on the substrate and a second photomask process is utilized to make the second metal layer form a source electrode and a drain electrode at two ends of the active layer. A second insulation layer is deposited on the substrate and a photoresist layer is formed on the second insulation layer, and a third photomask process is utilized to pattern the photoresist layer to form a first photoresist layer of a first thickness and a second photoresist layer of a second thickness, where the second thickness is greater than the first thickness. The first photoresist layer and the second photoresist layer are disposed at intervals and a gap region being formed therebetween, and the second insulation layer has a drain VIA hole formed with respect to the gap region. The first photoresist layer is removed, and suede is prepared on the second photoresist layer to form a suede on a surface of the second photoresist layer. A pixel electrode layer is deposited on the substrate, and a stripping liquid is used to permeate a surface uncovered by the pixel electrode layer from the suede of the second photoresist layer in wet etching. The second photoresist layer and the pixel electrode layer covering the second photoresist layer are removed so as to form a pixel electrode, which is connected to the drain electrode via the drain VIA hole. In the present invention, only three photomask processes are required to manufacture a TFT substrate, and it can be efficient to peel off the photoresist layer in depositing the pixel electrode layer after the step of preparing suede on the photoresist. Also, there is no obvious step configuration between the pixel electrode and the second insulation layer. The present invention improves the efficiency and reduces the difficulty in manufacture.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A TFT (Thin Film Transistor) substrate manufacture method, comprising the steps of:
   depositing a first metal layer on a substrate and utilizing a first photomask process to form a TFT gate electrode;
   depositing a first insulation layer, an active layer, and a second metal layer sequentially on the substrate and utilizing a second photomask process to make the second metal layer form a source electrode and a drain electrode at two ends of the active layer;
   depositing a second insulation layer on the substrate and forming a photoresist layer on the second insulation layer, and utilizing a third photomask process to pattern the photoresist layer to form a first photoresist layer of a first thickness and a second photoresist layer of a second thickness, where the second thickness is greater than the first thickness, the first photoresist layer and the second photoresist layer being disposed at intervals and a gap region being formed therebetween, and forming a drain VIA hole in the second insulation layer with respect to the gap region;

removing the first photoresist layer, and preparing suede on the second photoresist layer to form a suede on a surface of the second photoresist layer, and depositing a pixel electrode layer on the substrate, and permeating a surface uncovered by the pixel electrode layer from the suede of the second photoresist layer with a stripping liquid in wet etching, removing the second photoresist layer and the pixel electrode layer covering the second photoresist layer so as to form a pixel electrode, which is connected to the drain electrode via the drain VIA hole.

2. The TFT substrate manufacture method according to claim 1, wherein the step of forming the drain VIA hole in the second insulation layer with respect to the gap region comprises:

utilizing dry etching to forming the drain VIA hole in the second insulation layer with respect to the gap region.

3. The TFT substrate manufacture method according to claim 1, wherein the step of removing the first photoresist layer comprises:

utilizing a photoresist ashing process to make the first photoresist layer peel off.

4. The TFT substrate manufacture method according to claim 1, wherein the step of preparing suede on the second photoresist layer comprises:

utilizing dry etching to prepare suede on the second photoresist layer.

5. The TFT substrate manufacture method according to claim 4, wherein the suede on a photoresist surface is formed by nanopillars, a height of the nanopillars is 10 A to 10000 A with respect to the photoresist surface, and distances between the nanopillars are ranged from 10 A to 20000 A.

6. The TFT substrate manufacture method according to claim 4, wherein a gas utilized to prepare the suede is Ar, 03, He, SF6, CF4, C4F8, or their combinations, and a pressure adopted in the etching process is 5 mT to 10000 mT.

7. The TFT substrate manufacture method according to claim 1, wherein the step of depositing the first insulation layer, the active layer, and the second metal layer sequentially on the substrate comprises:

utilizing chemical vapor deposition to deposit the first insulation layer, the active layer, and the second metal layer sequentially on the substrate.

8. The TFT substrate manufacture method according to claim 1, wherein the pixel electrode layer is made of ITO (Indium Tm Oxide).

9. The TFT substrate manufacture method according to claim 1, wherein the second photomask process is a half-tone or a gray-tone photomask process.

10. The TFT substrate manufacture method according to claim 1, wherein the active layer is made of A-Si.

11. A TFT (Thin Film Transistor) substrate manufacture method, comprising the steps of:

depositing a first metal layer on a substrate and utilizing a first photomask process to form a TFT gate electrode;

depositing a first insulation layer, an active layer, and a second metal layer sequentially on the substrate and utilizing a second photomask process to make the second metal layer form a source electrode and a drain electrode at two ends of the active layer;

depositing a second insulation layer on the substrate and forming a photoresist layer on the second insulation layer, and utilizing a third photomask process to pattern the photoresist layer to form a first photoresist layer of a first thickness and a second photoresist layer of a second thickness, where the second thickness is greater than the first thickness, the first photoresist layer and the second photoresist layer being disposed at intervals and a gap region being formed therebetween, and utilizing dray etching to form a drain VIA hole in the second insulation layer with respect to the gap region;

utilizing a photoresist ashing process to make the first photoresist layer peel off so as to remove the first photoresist layer;

preparing suede on the second photoresist layer to form a suede on a surface of the second photoresist layer, and depositing a pixel electrode layer on the substrate, and permeating a surface uncovered by the pixel electrode layer from the suede of the second photoresist layer with a stripping liquid in wet etching, removing the second photoresist layer and the pixel electrode layer covering the second photoresist layer so as to form a pixel electrode, which is connected to the drain electrode via the drain VIA hole.

12. The TFT substrate manufacture method according to claim 11, wherein the step of preparing suede on the second photoresist layer comprises:

utilizing dry etching to prepare suede on the second photoresist layer.

13. The TFT substrate manufacture method according to claim 12, wherein the suede on a photoresist surface is formed by nanopillars, a height of the nanopillars is 10 A to 10000 A with respect to the photoresist surface, and distances between the nanopillars are ranged from 10 A to 20000 A.

14. The TFT substrate manufacture method according to claim 12, wherein a gas utilized to prepare the suede is Ar, O3, He, SF6, CF4, C4F8, or their combinations, and a pressure adopted in the etching process is 5 mT to 10000 mT.

15. The TFT substrate manufacture method according to claim 11, wherein the step of depositing the first insulation layer, the active layer, and the second metal layer sequentially on the substrate comprises:

utilizing chemical vapor deposition to deposit the first insulation layer, the active layer, and the second metal layer sequentially on the substrate.

16. The TFT substrate manufacture method according to claim 11, wherein the pixel electrode layer is made of ITO (Indium Tin Oxide).

17. The TFT substrate manufacture method according to claim 11, wherein the second photomask process is a half-tone or a gray-tone photomask process.

18. The TFT substrate manufacture method according to claim 11, wherein the active layer is made of A-Si.

19. The TFT substrate manufacture method according to claim 11, wherein the third photomask process is a half-tone or a gray-tone photomask process.

20. The TFT substrate manufacture method according to claim 11, wherein the active layer is made of SiO.

* * * * *